United States Patent
Hong et al.

(10) Patent No.: US 10,985,103 B2
(45) Date of Patent: Apr. 20, 2021

(54) APPARATUS AND METHOD OF FORMING BACKSIDE BURIED CONDUCTOR IN INTEGRATED CIRCUIT

(71) Applicant: Samsung Electronics Co., Ltd., Gyeonggi-do (KR)

(72) Inventors: Joon Goo Hong, Austin, TX (US); Rwik Sengupta, Austin, TX (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/577,591

(22) Filed: Sep. 20, 2019

(65) Prior Publication Data
US 2020/0279811 A1 Sep. 3, 2020

Related U.S. Application Data

(60) Provisional application No. 62/812,606, filed on Mar. 1, 2019.

(51) Int. Cl.
| H01L 23/528 | (2006.01) |
| H01L 21/768 | (2006.01) |
| H01L 23/50 | (2006.01) |
| H01L 23/522 | (2006.01) |
| H01L 23/532 | (2006.01) |

(52) U.S. Cl.
CPC .... H01L 23/5286 (2013.01); H01L 21/76879 (2013.01); H01L 23/50 (2013.01); H01L 23/5226 (2013.01); H01L 23/53257 (2013.01)

(58) Field of Classification Search
CPC . H01L 23/5286; H01L 23/50; H01L 23/5226; H01L 23/53257; H01L 1121/76879

USPC .......................................................... 257/763
See application file for complete search history.

(56) References Cited

U.S. PATENT DOCUMENTS

| 4,802,062 | A | 1/1989 | Blum et al. |
| 5,025,304 | A | 6/1991 | Reisman et al. |
| 6,495,454 | B2 | 12/2002 | Livengood et al. |
| 6,670,716 | B2 | 12/2003 | Christensen et al. |
| 7,033,901 | B2 | 4/2006 | Husher |

(Continued)

OTHER PUBLICATIONS

Ryckaert, J. et al., The Complementary FET (CFET) for CMOS scaling beyond N3, 2018 Symposium on VLSI Technology Digest of Technical Papers, Jun. 18-22, 2018, Honolulu, HI, pp. 141-142.

(Continued)

Primary Examiner — Tong-Ho Kim
(74) Attorney, Agent, or Firm — The Farrell Law Firm, P.C.

(57) ABSTRACT

An integrated circuit (IC) apparatus and a method of forming a conductive material in a backside of an IC are provided. The IC apparatus includes a substrate including a frontside and a backside; at least one first insulating material deposited in the backside of the substrate in a form of a trench; a conductive material deposited in each of the at least one first insulating material; at least one second insulating material deposited on the conductive material to insulate the conductive material from the substrate; an epitaxial crystalline material grown on the frontside of the substrate; at least one semiconductor component formed in the epitaxial crystalline material; and at least one via formed in the substrate to connect the conductive material to the at least one semiconductor component.

20 Claims, 5 Drawing Sheets

(56) References Cited

U.S. PATENT DOCUMENTS

| | | |
|---|---|---|
| 9,570,395 B1 | 2/2017 | Sengupta et al. |
| 2011/0068475 A1* | 3/2011 | de Fresart ......... H01L 21/76879 |
| | | 257/774 |
| 2014/0167120 A1* | 6/2014 | Chi ....................... H01L 21/845 |
| | | 257/288 |
| 2018/0026042 A1 | 1/2018 | Smith et al. |
| 2018/0145030 A1 | 5/2018 | Beyne et al. |
| 2018/0294267 A1 | 10/2018 | Licausi et al. |
| 2018/0308762 A1 | 10/2018 | Anderson et al. |
| 2018/0374791 A1 | 12/2018 | Smith et al. |

OTHER PUBLICATIONS

Kim, Ryoung-han et al., Design and pitch scaling for affordable node transition and EUV insertion scenario, Design-Process-Technology Co-optimization for Manufacturability XI 2017, San Jose,California, 8 pages.

* cited by examiner ps that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

APPARATUS AND METHOD OF FORMING BACKSIDE BURIED CONDUCTOR IN INTEGRATED CIRCUIT

PRIORITY

This application is based on and claims priority under 35 U.S.C. § 119(e) to a U.S. Provisional Patent Application filed on Mar. 1, 2019 in the United States Patent and Trademark Office and assigned Ser. No. 62/812,606, the entire contents of which are incorporated herein by reference.

BACKGROUND

Description of the Related Art

There is a demand for thermal budgeting, reduced process complexity, and interconnect routing freedom for scaling in ICs.

A frontside buried power rail (BPR) has been used as a scaling booster to free up routing space and reduce cell height. Freed-up routing area allows relaxed metal pitch and reduces the effects of electromigration (EM) and voltage drop (e.g., current (I) times resistance (R), or IR, drop). However, there is a thermal budget concern for frontside BPR. That is, there is a thermal stress due to metal expansion during front-end of line (FEOL) processing and a chance of metal contamination before high dielectric constant (k) metal gate (HKMG) processing. Thus, there is a routing limitation because of less and less space for metal routing as scaling of technology increases. Accordingly, the present disclosure provides an apparatus and a method to free up routing space and reduce cell height.

SUMMARY

According to one embodiment, an IC apparatus is provided. The IC apparatus includes a substrate including a frontside and a backside; at least one first insulating material deposited in the backside of the substrate in a form of a trench; a conductive material deposited in each of the at least one first insulating material; at least one second insulating material deposited on the conductive material to insulate the conductive material from the substrate; an epitaxial crystalline material grown on the frontside of the substrate; at least one semiconductor component formed in the epitaxial crystalline material; and at least one via formed in the substrate to connect the conductive material to the at least one semiconductor component.

According to one embodiment, a method of forming a conductive material in a backside of an IC is provided. The method includes obtaining a substrate having a frontside and a backside; etching at least one area of the substrate for at least one conductor; depositing at least one first insulating material in the at least one etched area; depositing conductive material in the at least one etched area; depositing at least one second insulating material on the conductive material; growing an epitaxial crystalline material on the frontside of the substrate; and forming at least one semiconductor component in the frontside of the substrate that connects to the conductive material.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1A:
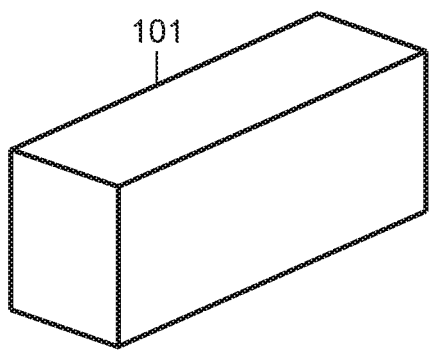
FIGS. 1A, 1B, 1C, 1D, 1E, 1F, 1G, 1H, 1I, 1J, 1K, 1L, and 1M, are diagrams of an IC with a backside buried conductor, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The present disclosure discloses an apparatus and a method of freeing up routing space and reducing cell height. A semiconductor wafer backside metal process may decongest front-side routing.

In an embodiment, a backside of a semiconductor wafer is processed before a front-side of the semiconductor wafer is processed. A process may be a single line (e.g., single Damascene) buried power rail. However, the present disclosure is not limited to a single line buried power rail. Any type of conductor (e.g., a signal line) may be buried in the backside of a semiconductor wafer.

In an embodiment, at least one conductor is formed in a backside of a semiconductor wafer (e.g., with a Damascene process) before FEOL processing of the semiconductor wafer begins. Tungsten (W) conductors may be formed in the backside of the semiconductor wafer to avoid a thermal budget of an FEOL process. The present disclosure requires minimal modification to a middle of line (MOL) process for a process of record (POR). In addition, the present disclosure does not introduce any issue concerning metal protocol during FEOL processing.

In an embodiment, a metal line may be formed in a backside of a semiconductor wafer using a Damascene process (e.g., a single or dual Damascene process). Epitaxial silicon (Si) may be grown after metal line formation at the backside of the semiconductor wafer. However, the present disclosure is not limited to using Si. Any suitable semiconductor material (e.g., germanium (Ge), gallium arsenide (GaAs), etc.) may be used. Thus, metal routing may be freed up by forming a conductor in the backside of the semiconductor wafer, and compatibility with various metallization technologies having a thermal stability over 900° C. (for example, W and ruthenium (Ru)) may be improved.

In an embodiment, a semiconductor device may comprise a conductor (e.g., a power rail) formed in a substrate (e.g., a Si substrate). A dielectric material is formed to surround the conductor in order to isolate the conductor from other conductive pattern structures. An opening may be formed in the substrate, where the opening may be filled with a conductive material to selectively connect the conductor to another conductive pattern structure.

The dielectric material surrounding the buried backside conductor (e.g., a power rail) may be etch-selective Si to enable self-alignment for generating an opening for forming a connection using a conductive material.

The backside buried connector (e.g., a power rail) may be formed of a metal material that exhibits thermal stability above 900° C.

In an embodiment, a metal material may be a refractive metal (e.g., Ru). A conductor may be formed by filling a conductor opening with a refractive metal and etching back the refractive metal to a certain depth.

In an embodiment, a method for manufacturing a semiconductor device may include forming a conductor (e.g., a power rail) in a backside of a semiconductor substrate (e.g., an Si substrate), surrounding the power rail with a dielectric material that isolates the conductor from the substrate, and selectively stopping an etch process to form an opening to the conductor, where the opening is filled with a conductive material to connect the connector to another conductive routing layer.

Forming a conductor within a semiconductor substrate may include etching a trench within the substrate and forming the conductor within the trench. A dielectric material may be deposited in the trench prior to the conductive material being deposited in the trench. Forming the conductor may further include forming the power rail using a conductive material with a thermal stability above 900° C. (e.g., W, Ru, etc.).

Forming a conductor using a conductive material with a thermal stability above 900° C. (e.g., W, Ru, etc.) may further include filling an opening in a trench with the conductive material, polishing the conductive material by etching back the conductive material to a certain depth, surrounding the conductive material with a dielectric material deposition, and exposing the semiconductor substrate (e.g., Si) outside of the conductor with a dielectric polish. Forming a conductor using W or Ru with a dielectric deposition may further include crystalline Si epitaxial growth at the backside of a Si substrate. The dielectric material surrounding the conductor may be used as an etch stop layer from the front side of the substrate while connecting a metal routing layer to the conductor.

A metal line may be embedded within a substrate to help mitigate substrate bending.

A starting semiconductor substrate (e.g., a bare Si substrate) thinner (e.g., less than or equal to 100 um) than the thickness of a standard semiconductor substrate (e.g., 775 um for a 300 mm semiconductor wafer) may increase wafer generation yield from ingot growth.

Accordingly, the present disclosure may provide improved cell scaling with the ability to decongest metal routing over a gate level. In addition, a mechanical strength of a semiconductor substrate may be enhanced by embedding metal lines in the substrate, which makes the substrate more rigid and less susceptible to bending.

FIGS. 1A, 1B, 1C, 1D, 1E, 1F, 1G, 1H, 1I, 1J, 1K, 1L, and 1M, are diagrams of an IC with a backside buried conductor, according to an embodiment. A backside metal process for a semiconductor wafer may decongest a front-side routing resource. For example, a single Damascene process is illustrated. However, the present disclosure is not limited to using a single Damascene process. Any suitable process may be used (e.g., a dual-Damascene process). In addition, a Si process is illustrated. However, the present disclosure is not limited to a Si process, and any suitable process (e.g., Ge, GaAs, etc.) may be used.

Referring to FIG. 1A, the IC includes a semiconductor wafer or substrate 101. For example, the substrate 101 may have a thickness of less than or equal to 100 um. However, the present disclosure is not limited to this thickness range and any suitable thickness may be used. A substrate of a certain thickness may be achieved by polishing a standard semiconductor wafer or by cutting off a certain thickness of a semiconductor wafer from a semiconductor ingot.

Figure 1B:
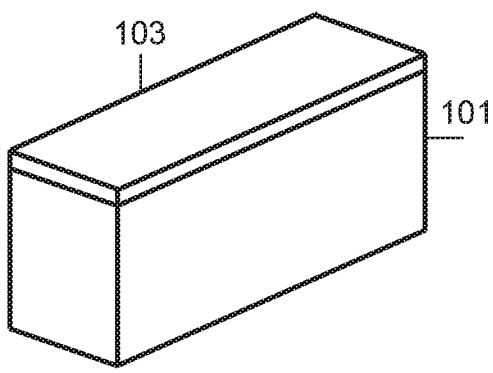

Referring to FIG. 1B, a hardmask dielectric 103 is deposited on a backside of the substrate 101.

Figure 1C:
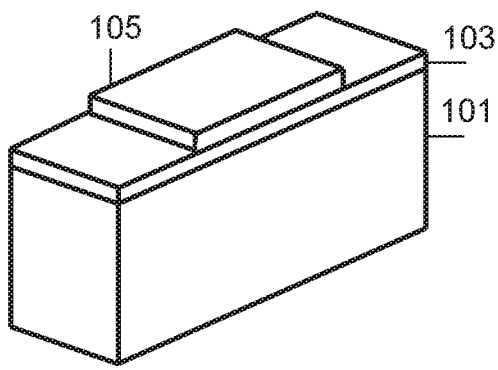

Referring to FIG. 1C, the hardmask dielectric 103 is deposited over a predetermined area of the substrate 101. The hardmask dielectric 103 may be deposited using lithographic methods. The hardmask dielectric 103 may be silicon nitride (SiN) and titanium nitride (TiN).

Figure 1D:
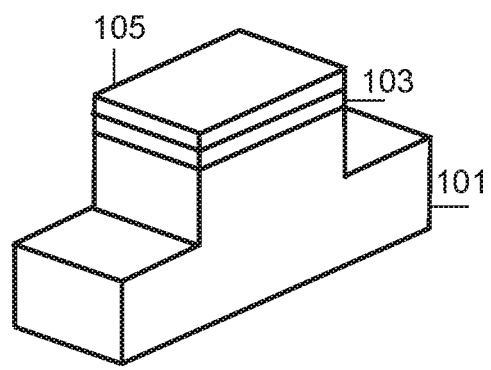

Referring to FIG. 1D, the substrate 101 is etched in areas other than where the hardmask dielectric 103 is located to form areas in which at least one backside buried conductor is to be placed. In FIG. 1D, two areas for two backside buried power rails is illustrated. However, the present disclosure is not limited to forming power rails or to forming two power rails. In the present disclosure, any type of conductor (e.g., a signal line) and any number of conductors may be formed in the backside of the substrate 101 to decongest a conductor pattern on the front-side of the substrate 101. The substrate 101 may be etched using a dry etch and the depth of the etched material may be in the range of less than or equal to 95 um. However, the present disclosure is not limited to a dry etch or to an etch depth of less than or equal to 95 um. In the present disclosure, any suitable etch method and etch depth may be used.

Figure 1E:
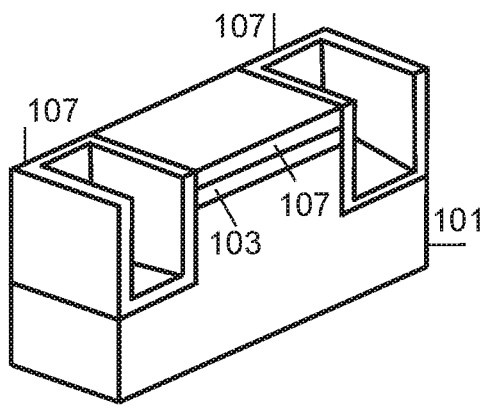

Referring to FIG. 1E, an insulating layer 107 is deposited on the substrate 101 to form enclosures where conductors are to be formed. The insulating material 107 may be the same material as the hardmask dielectric 103 in FIG. 1D. Thus, the hardmask dielectric 103 in FIG. 1D is shown as an insulating layer 107 in FIG. 1E. The insulating layer 107 may be thin. The insulating layer 107 may be SiN and TiN. However, the present disclosure is not limited thereto and any suitable insulating layer may be used.

Material down to the hardmask dielectric 103 is removed to leave the substrate 101 and isolated enclosures of the insulating layer 107. Any suitable method for removing the material (e.g., etching, mechanical grinding, etc.) may be used.

Figure 1F:
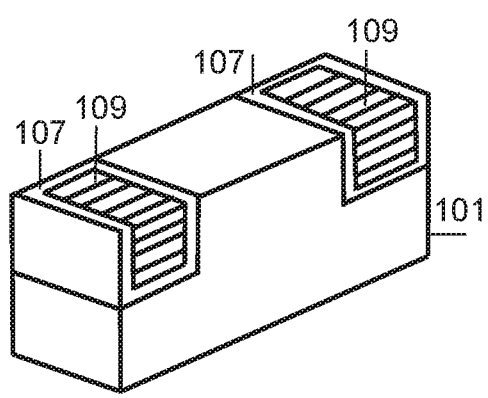

Referring to FIG. 1F, a conductive material (e.g. a metal) 109 is deposited into the SiN and TiN enclosures 107 formed in the substrate 101 to form the conductors and the conductive material 109 is polished so that the substrate 101 between the conductors formed by the conductive material 109 is exposed on the backside of the substrate 101. The conductive material 109 may be W, Ru, or any other suitable metal or conductive material (e.g., a conductive material with a thermal stability above 900° C.).

Figure 1G:
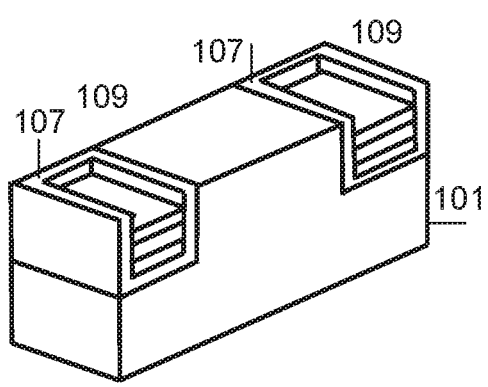

Referring to FIG. 1G, a recess is formed on the conductive material 109. The recess may be formed by polishing. However, any suitable method for forming a recess may be used. The recess may have a slight depth, but the recess may be any suitable depth.

Figure 1H:
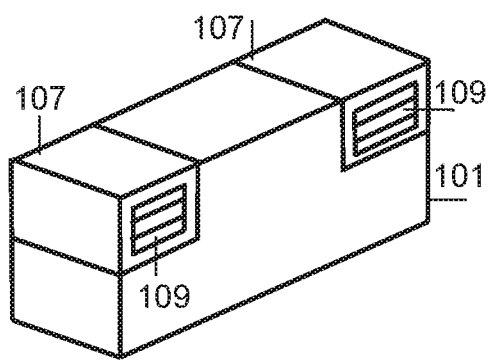

Referring to FIG. 1H, SiN is deposited into the recesses to insulate the conductors formed by the conductive material 109 on the backside of the substrate 101 and the backside of the substrate 101 is polished to expose the substrate 101 between the conductors.

Figure 1I:
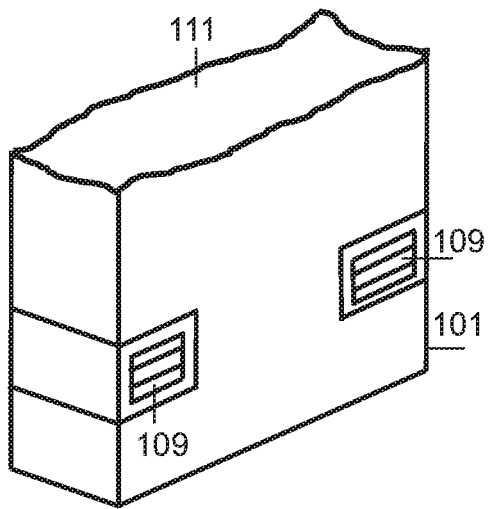

Referring to FIG. 1I, epitaxial crystalline material 111 is grown at the backside of the substrate 101. If the substrate 101 is Si then the epitaxial crystalline material 111 is Si. However, the substrate 101 may be any semiconductor material for which an epitaxial crystalline may be grown (e.g., Ge, GaAs, etc.). The exposed Si on the backside of the substrate 101 is a seed layer for growing the epitaxial crystalline material 111. The epitaxial crystalline material 111 may have a thickness of, for example, less than or equal to 750 um. However, the epitaxial crystalline material 111 may have any other suitable thickness.

Figure 1J:
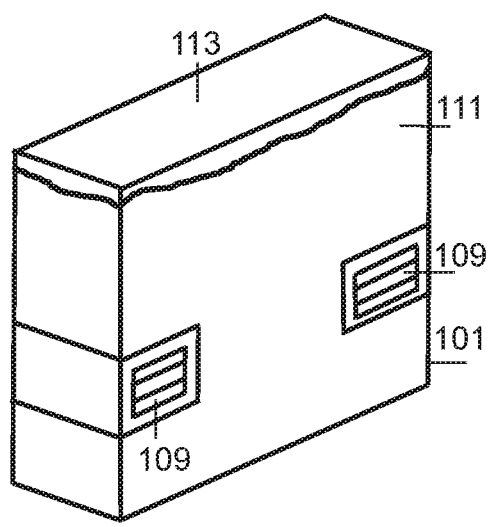

Referring to FIG. 1J, a polishing slurry is applied to the epitaxial crystalline material 111. However, the present disclosure is not limited to using a polishing slurry. Any suitable method for polishing the substrate 101 may be used.

Figure 1K:
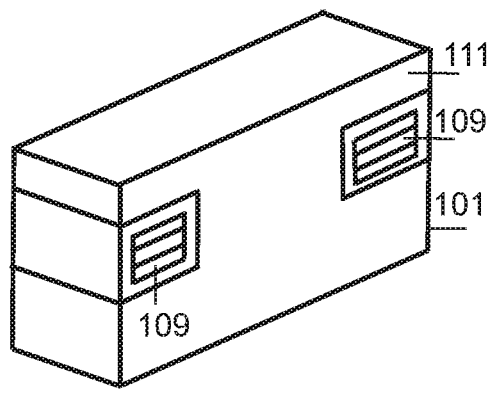

Referring to FIG. 1K, the backside of the substrate 101 is polished flat. The substrate 101 may be polished to a target flatness of the current standard for a bare Si wafer. However, the present disclosure is not limited to this flatness target, and any other suitable flatness target may be used.

Figure 1L:
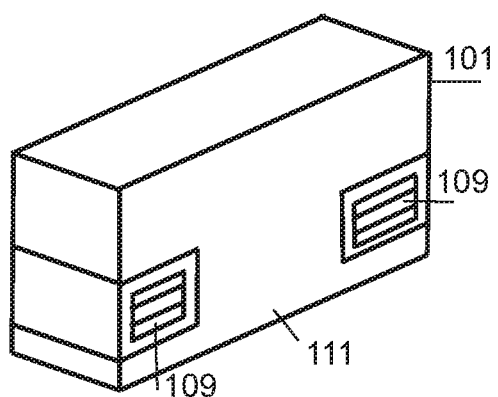

Referring to FIG. 1L, the substrate 101 is flipped vertically so that the frontside of the substrate 101 is on top and the backside of the substrate 101 is on the bottom.

Figure 1M:
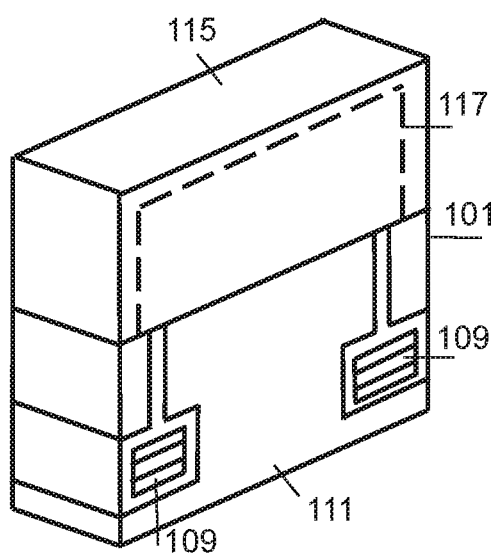

Referring to FIG. 1M, FEOL processing of the substrate is performed to form at least one IC component 117 (e.g. fin field effect transistor (FinFET) or nanosheet FET) and connection between the at least one IC component and the conductive material 109 of the conductors is performed. After the FEOL processing is completed (e.g., up to a replacement metal gate step in a standard FinFET/nanosheet FET flow), a via to the conductive material 109 of the conductors is formed and contacts to the conductive material 109 of the conductors are made to connect the connectors to the at least one IC components (e.g., connections to a source, a drain and a gate are patterned). Extreme ultraviolet light (EUV) patterning may be used for the contact to the backside buried conductors formed by the conductive material 109. Therefore, an overlay limit may be less than 5 nm as is achievable with EUV. Overlay measurement may be done with infrared (IR) radiation as used in a through-silicon-via (TSV) process to detect a mark through Si. Conventional back end of line (BEOL) processing may then be done.

Improvements provided by the present disclosure include, but is not limited to, (1) metal line formation done at the backside of a semiconductor wafer instead of at the frontside of a semiconductor wafer, (2) semiconductor processing (e.g., single and dual Damascene processing) is done at the backside of a semiconductor wafer, (3) epitaxial crystalline Si growth after conductor formation may be done at the backside of a semiconductor wafer, (4) conductor routing at the frontside of a semiconductor wafer is freed up by forming conductors in the backside of the semiconductor wafer, (5) compatibility with various metallization technologies (for example, W and Ru) which have thermal stability above 900° C., (6) cell scaling with decongested conductor routing over the gate level, and (7) enhanced mechanical strength of the semiconductor substrate by embedding conductive lines in the backside of the substrate, which increases the rigidity of the substrate and makes the substrate less susceptible to bending.

Figure 2:
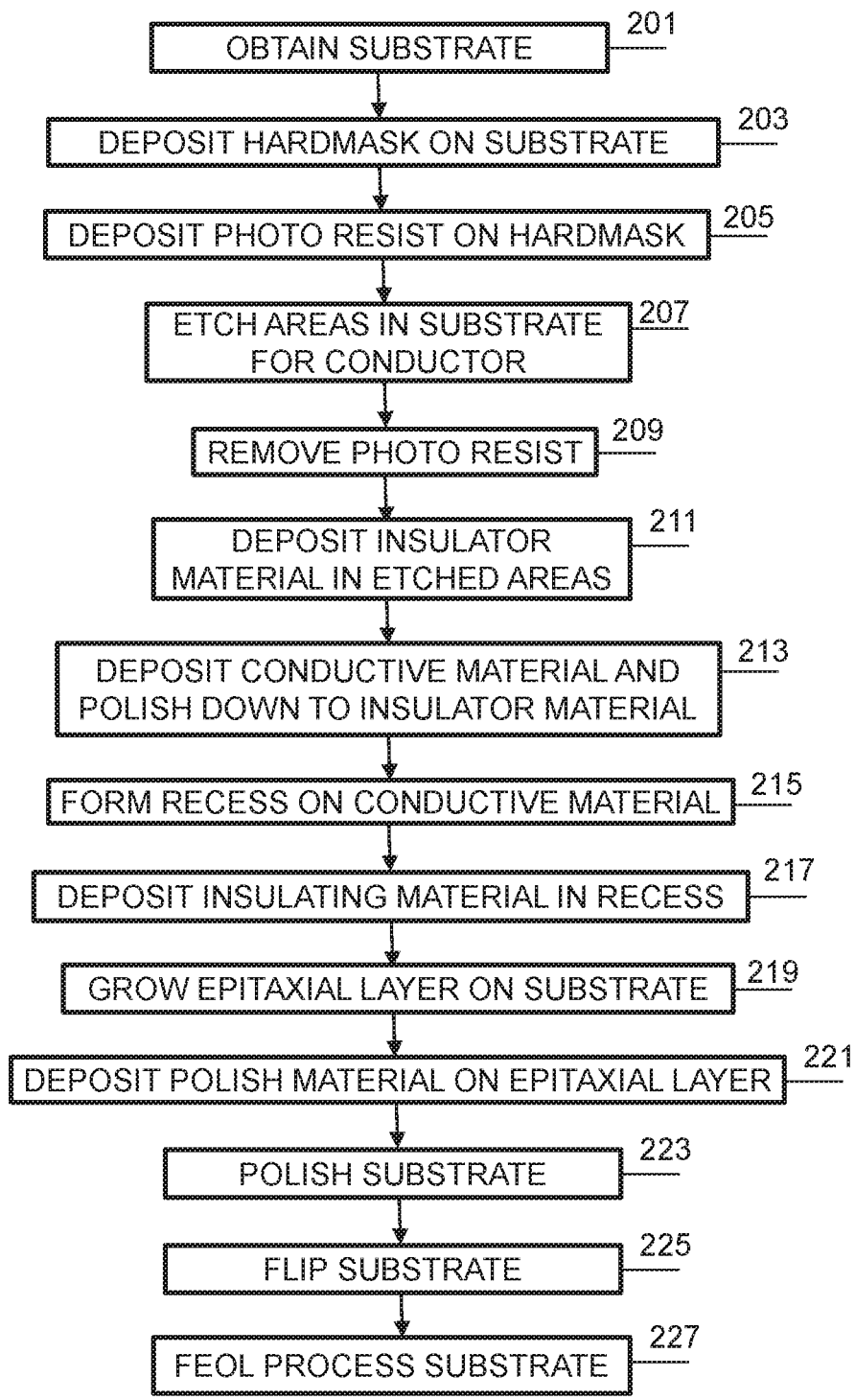
FIG. 2 is a flowchart of a method of forming an IC with a backside buried conductor, according to one embodiment.

FIG. 2 is a flowchart of a method of forming an IC with a backside buried conductor, according to one embodiment.

Referring to FIG. 2, at 201, a semiconductor wafer or substrate is obtained. For example, the substrate may have a thickness of less than or equal to 100 um. However, the present disclosure is not limited to this thickness range and any suitable thickness may be used. A substrate of a certain thickness may be achieved by polishing a standard semiconductor wafer or by cutting off a certain thickness of a semiconductor wafer from a semiconductor ingot.

At 203, a hardmask is deposited on a backside of the substrate.

At 205, photo resist is deposited on the hardmask over a predetermined area of the substrate. The photo resist may be deposited using lithographic methods.

At 207, the substrate is etched in areas other than where the mask is located to form areas in which at least one backside buried conductor is to be placed. In the present disclosure, any type of conductor (e.g., a signal line) and any number of conductors may be formed in the backside of the substrate to decongest a conductor pattern on the front-side of the substrate. The substrate may be etched using a dry etch and the depth of the etched material may be in the range of less than or equal to 95 um. However, the present disclosure is not limited to a dry etch or to an etch depth of less than or equal to 95 um. In the present disclosure, any suitable etch method and etch depth may be used.

At 209, the photo resist is removed. Any suitable method for removing photo resist may be used.

At 211, an insulating material is deposited on the substrate to form enclosures where conductors are to be formed. The insulating material may be thin. The insulating material may be SiN and TiN but the present disclosure is not limited thereto. Any suitable insulating material may be used.

At 213, a conductive material (e.g., a metal) 109 is deposited into the insulating material enclosures formed in the substrate to form the conductors and the conductive material is polished down to the insulating material so that the substrate between the conductors formed by the conductive material is exposed on the backside of the substrate. The conductive material may be W, Ru, or any other suitable metal or conductive material (e.g., a conductive material with a thermal stability above 900° C.).

At 215, a recess is formed on the conductive material. The recess may be formed by polishing. However, any suitable method for forming a recess may be used. The recess may have a slight depth, but the recess may be any suitable depth.

At 217, an insulating material is deposited into the recesses to insulate the conductors formed by the conductive material on the backside of the substrate and the backside of the substrate is polished to expose the substrate between the conductors. The insulating material may be SiN, but the present disclosure is not limited thereto. Any suitable insulating material may be used.

At 219, epitaxial crystalline material is grown at the backside of the substrate. If the substrate is silicon then the epitaxial crystalline material is Si. However, if a different semiconductor material for which an epitaxial crystalline material may be grown (e.g., Ge, GaAs, etc.) is used for the substrate then the epitaxial crystalline material may be different. The exposed Si on the backside of the substrate is a seed layer for growing the epitaxial crystalline material. The epitaxial crystalline material may have a thickness of, for example, less than or equal to 750 um. However, the epitaxial crystalline material may have any other suitable thickness.

At 221, a polishing slurry is applied to the epitaxial crystalline material. However, the present disclosure is not limited to using a polishing slurry. Any suitable method for polishing the substrate may be used.

At 223, the backside of the substrate is polished flat. The substrate may be polished to a target flatness of the current standard for a bare Si wafer. However, the present disclosure is not limited to this flatness target, and any other suitable flatness target may be used.

At 225, the substrate is flipped vertically so that the frontside of the substrate is on top and the backside of the substrate is on the bottom.

At 227, FEOL processing of the substrate is performed to form at least one IC component (e.g. a FinFET, nanosheet FET, etc.) and a connection between the at least IC component and the conductive material of the conductors is performed. After the FEOL processing is completed (e.g., up to a replacement metal gate step in a standard FinFET/nanosheet FET flow), a via to the conductive material of the conductors is formed and contacts to the conductive material of the conductors are made to connect the connectors to the at least one IC components (e.g., connections to a source, a drain and a gate are patterned). EUV patterning may be used for the contact to the backside buried conductors formed by the conductive material. Therefore, an overlay limit may be less than 5 nm and is achievable with EUV. Overlay measurement may be done with IR radiation as used in a TSV process to detect a mark through Si. Conventional BEOL processing may then be performed.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An integrated circuit (IC) apparatus, comprising:
a substrate including a frontside and a backside;
at least one first insulating material deposited in the backside of the substrate in a form of a trench;
a conductive material deposited in each of the at least one first insulating material;
at least one second insulating material deposited on the conductive material to insulate the conductive material from the substrate;
an epitaxial crystalline material grown on the backside of the substrate;
at least one semiconductor component formed on the frontside; and
at least one via formed in the substrate to connect the conductive material to the at least one semiconductor component.

2. The IC apparatus of claim 1, wherein the substrate is of a material selected from one of silicon (Si), germanium (Ge), and gallium arsenide (GaAs).

3. The IC apparatus of claim 1, wherein the substrate has a thickness of less than or equal to 100 um.

4. The IC apparatus of claim 1, wherein the at least one first insulating material and the at least one second insulating material are a dielectric material of silicon nitride (SiN).

5. The IC apparatus of claim 1, wherein the conductive material is a refractory metal having a thermal stability greater than 900° C.

6. The IC apparatus of claim 1, where the conductive material is tungsten (W) or ruthenium (Ru).

7. The IC apparatus of claim 1 wherein the conductive material is a power rail or a signal line.

8. The IC apparatus of claim 1, wherein the at least one semiconductor component is a fin field effect transistor (FinFET) or a nanosheet FET.

9. The IC apparatus of claim 1, wherein the at least one semiconductor component is formed using a single Damascene process or a dual Damascene process.

10. The IC apparatus of claim 1, wherein the epitaxial crystalline material is grown to a thickness of less than or equal to 750 um.

11. A method of forming a conductive material in a backside of an integrated circuit (IC), comprising:
obtaining a substrate having a frontside and a backside;
etching at least one area of the substrate for at least one conductor;
depositing at least one first insulating material in the at least one etched area;
depositing conductive material in the at least one etched area;
depositing at least one second insulating material on the conductive material;
growing an epitaxial crystalline material on the backside of the substrate;
forming at least one semiconductor component in the frontside of the substrate that connects to the conductive material; and
forming at least one via in the substrate to connect the conductive material to the at least one semiconductor component.

12. The method of claim 11, wherein the substrate is of a material selected from one of silicon (Si), germanium (Ge), and gallium arsenide (GaAs).

13. The method of claim 11, wherein the substrate has a thickness of less than or equal to 100 um.

14. The method of claim 11, wherein the at least one first insulating material and the at least one second insulating material are a dielectric material of silicon nitride (SiN).

15. The method of claim 11, wherein the conductive material is a refractory metal having a thermal stability greater than 900° C.

16. The method of claim 11, wherein the conductive material is tungsten (W) or ruthenium (Ru).

17. The method of claim 11 wherein the conductive material is a power rail or a signal line.

18. The method of claim 11, wherein the at least one semiconductor component is a fin field effect transistor (FinFET) or a nanosheet FET.

19. The method of claim 11, wherein the at least one semiconductor component is formed using a single Damascene process or a dual Damascene process.

20. The method of claim 11, wherein the epitaxial crystalline material is grown to a thickness of less than or equal to 750 um.

* * * * *